United States Patent [19]

Rosvold

[11] 4,129,042

[45] Dec. 12, 1978

[54] SEMICONDUCTOR TRANSDUCER PACKAGED ASSEMBLY

[75] Inventor: Warren C. Rosvold, Sunnyvale, Calif.

[73] Assignee: Signetics Corporation, Sunnyvale, Calif.

[21] Appl. No.: 852,909

[22] Filed: Nov. 18, 1977

[51] Int. Cl.² .............................................. G01L 9/06
[52] U.S. Cl. .................... 73/727; 73/517 R; 338/2; 338/42; 73/767; 73/777
[58] Field of Search ................. 73/721, 727, 88.5 SD, 73/517 R, 717; 338/2, 5, 42, 47

[56] References Cited

U.S. PATENT DOCUMENTS 4,050,049  9/1977  Youmans ................................. 338/5
4,071,838  1/1978  Block .................................. 73/517 R

*Primary Examiner*—Donald O. Woodiel
*Attorney, Agent, or Firm*—Jerry A. Dinardo; Jack Oisher; Frank R. Trifari

[57] ABSTRACT

A semiconductor transducer chip is flip-chip bonded to a semiconductor interface chip, which is mounted on the ceramic package. Thermal coupling between the package and the transducer chip is minimized by the small contact area between the transducer chip and interface chip. Micron size spacing between the spring membrane in the transducer chip and the interface chip produces squeeze film damping of the spring membrane.

11 Claims, 6 Drawing Figures

4,129,042

SEMICONDUCTOR TRANSDUCER PACKAGED ASSEMBLY

BACKGROUND OF THE INVENTION

This invention relates to semiconductor force transducers, and more particularly to an improved packaging means for a transducer employing a folded leaf spring membrane.

In U.S. Pat. No. 4,050,049 issued Sept. 20, 1977, to Albert P. Youmans and assigned to the same assignee of this invention, there is disclosed a force transducer which employs a semiconductor chip having a thin membrane formed in the shape of a folded cantilever spring. The semiconductor spring membrane incorporates four piezoresistive elements formed by ion implants or diffusions at high stress regions of the spring membrane. Two of the piezoresistive elements are oriented so that their resistance increases with acceleration and the other two are oriented so that their resistance decreases with acceleration. The piezoresistive elements are connected in a bridge configuration so thay any acceleration unbalances the bridge and produces a signal that is directly proportional to the acceleration force.

Several requirements must be met by the packaged transducer to make it function properly. It must be thermally isolated from the environment so that the transducer will be insensitive to external changes in temperature. For operation as an accelerometer, the spring membrane must be critically damped so as not to produce a signal after the accelerating force has terminated. Lastly, the transducer must be protected from corrosive or electrically conductive environments.

SUMMARY OF THE INVENTION

A semiconductor force transducer in a packaged assembly includes a semiconductor interface chip for mounting the transducer chip spaced apart from the package so as to thermally isolate the transducer chip from the package. The spring membrane of the transducer chip is surrounded by a supporting frame whose underside is secured to the top side of the interface chip at a discrete number of spaced locations, as by flip chip bonding, for minimizing thermal transfer. The bonding means are dimensioned so that a small micron-size gap formed between the spring membrane and the top side of the interface chip permits limited flexure of the spring membrane while it is subjected to mechanical force but which effectuates squeeze film damping of the spring membrane's vibratory motion after removal of the mechanical force. The interface and transducer chips are enclosed within a cap hermetically sealed to the package.

DESCRIPTION OF THE PREFERRED EMBODIMENT

Figure 1:
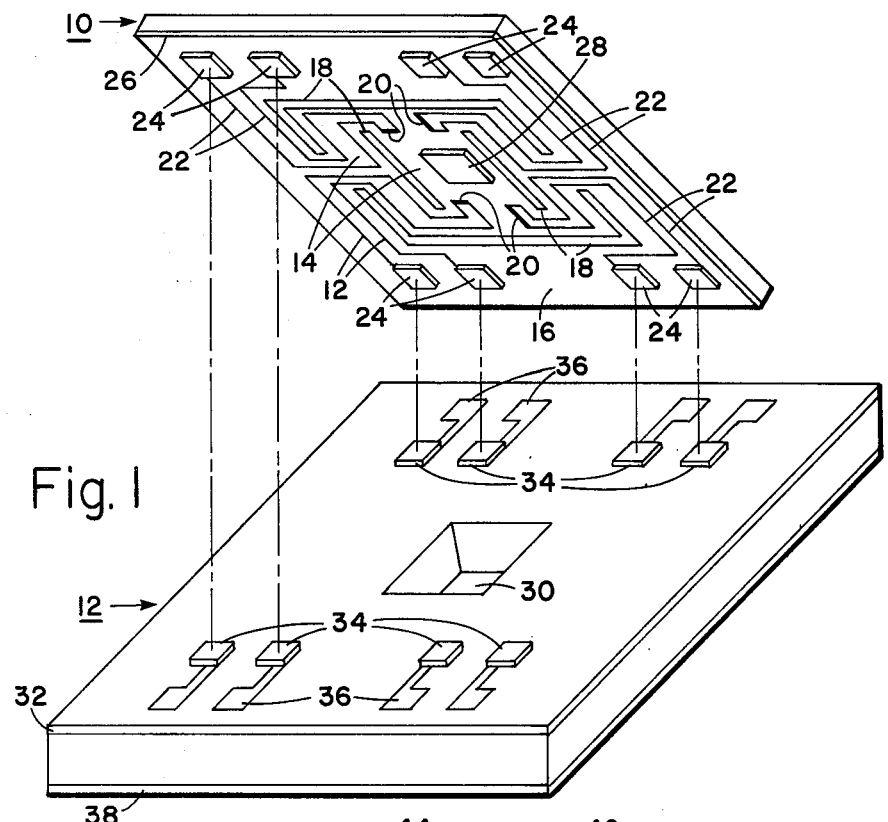
FIG. 1 is an exploded view, in perspective, showing the top side of an interface semiconductor chip and the bottom side of a semiconductor transducer chip positioned prior to assembly according to the invention.

Reference is now made to FIG. 1 which shows an exploded view of a transducer member of chip 10 and an interface member or chip 12 upon which the transducer chip 10 is to be mounted according to the invention. The transducer chip 10 is made of semiconductor material, which preferably is monocrystalline N type silicon having $<100>$ crystalline orientation. The $<100>$ crystalline silicon is preferred over $<111>$ crystalline silicon because of its unique ability to be chemically shaped into precise three-dimensional geometries with mathematical predictability. The silicon chip 10 must be anisotropically etched to form the complex re-entrant structure of the transducer spring membrane shown generally at 14.

The spring membrane 14, located centrally within the transducer chip 10, is bordered by a supporting frame member 16. As disclosed more fully in U.S. Pat. No. 4,050,049 to Albert P. Youmans referred to above and herein incorporated by reference, the transducer chip 10 is formed by anisotropically etching a chip of $<100>$ silicon to produce a recess in the face of the chip 10 viewed as the top in FIG. 1 and etching a pattern 18 of slots through the bottom of the recess. The finished structure is a thin, double E shaped leaf spring membrane 14 which is cantilevered from two opposing side margins of the thick frame member 16. The bottom surface of the frame member 16 and the spring membrane 14 are flush with each other.

The spring membrane 14 carries a number of piezoresistors 20, four of which are shown located at points where the spring membrane 14 will experience high mechanical stress when subjected to an external force. The piezoresistors 20 at each end of the transducer membrane 14 may be oriented perpendicular to each other, as shown, or in some cases where it is necessary to compensate for certain pre-stress conditions resulting from thermal processing, they may be oriented parallel with one another.

The piezoresistors 20 are preferably formed by ion implanting a suitable dosage of boron atoms in the N type silicon membrane 14. A dosage of $10^{15}$ atoms/cm$^2$ of boron giving a sheet resistivity of 1300 ohms/sq. has been found suitable. Each piezoresistor 20 may comprise two or more implanted regions formed as line segments which are connected at alternate ends by conductive meterial in a serpentine pattern.

The piezoresistors 20 are individually connected by way of conductors 22 to conductive bonding pads 24 located on the frame member 16. The conductors 22 and bonding pads 24 are deposited on an insulating layer 26 of silicon dioxide.

When the transducer chip 10 is used as part of an accelerometer, it carries a reaction mass 28 located centrally on the spring membrane 14. The reaction mass 28, which is made of material having a higher density than the silicon spring membrane 14, may comprise two squares of gold, each of 10 mgs. in weight, bonded to opposite sides of the spring membrane 14.

The interface chip 12 is also made of semiconductor material similar to that of the transducer chip 10 and may have opposite P type doping, or the same N type doping. The interface chip 12 is somewhat larger in length and breadth than the transducer chip 10. The interface chip 12 is provided with a central aperture 30 which is larger in size than the reaction mass 28 on the transducer chip 10 and which aligns with the reaction mass 28 when the two chips 10 and 12 are brought together, thereby permitting free movement of the reaction mass 28 during operation of the transducer chip 10 as part of an accelerometer.

The top side of the interface chip 12 facing the transducer chip 10 has an insulating layer 32 of silicon dioxide which carries a plurality of conductive solder pads 34 equal in number to the bonding pads 24 on the transducer chip 10. The set of solder pads 34 on the interface chip 12 are arranged physically to mate with the set of bonding pads 24 on the transducer chip 10.

The solder pads 34 connect conductively to wire bonding pads 36 located near the marginal edges of the interface chip 12. The wire bonding pads 36 are located outside the perimeter of the area to be encompassed by the transducer chip 10 and are used to form wire bond connections to the bonding pads on the package, as will be shown in another figure.

The bottom side of the interface chip 12 is coated with a layer 38 of gold for soldering the interface chip 12 to the package.

Figure 2:
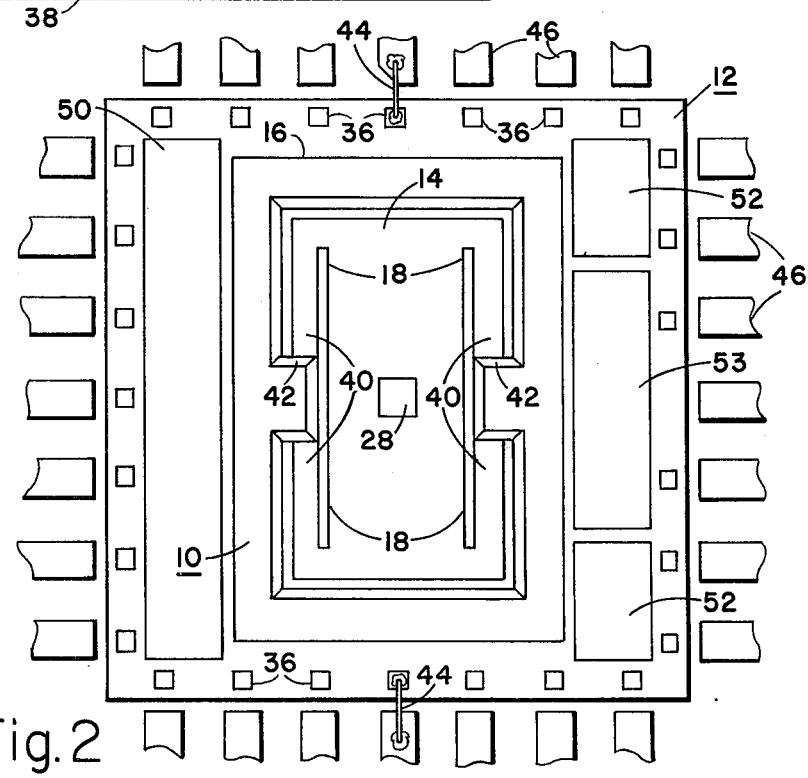
FIG. 2 is a top plan view, with portions removed, of an accelerometer employing a transducer chip assembled on an interface chip according to the invention.
Figure 3:
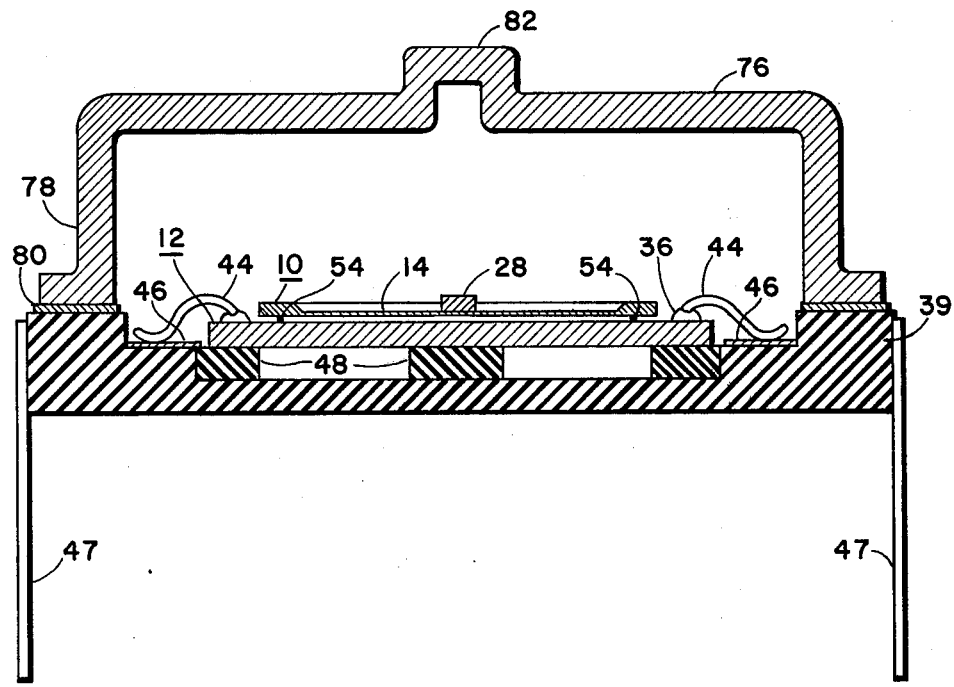
FIG. 3 is a side elevational view, partly in section, of the accelerometer of FIG. 2, assembled in a sealed package.

The transducer chip 10 and interface chip 12 are shown assembled to the package 39 in FIGS. 2 and 3, which are top plan and partly cross sectional views, respectively. As seen in FIGS. 2 and 3, the spring membrane 14 is recessed below the top surface of the frame member 16. Further, as a result of the slot pattern 18, the spring membrane 14 is cantilevered at four locations by four inwardly direct opposing outer legs 40 of the spring membrane 14 supported from the bottom of two pillars 42 jutting inwardly from the main body of the frame member 16.

The wire bonding pads 36 of the interface chip 12 are connected by wires 44, two of which are shown, to the wire bonding pads 46 of the package 39, which wire bonding pads 46 are internally connected, by means not shown, to external leads 47. The interface chip 12 is bonded to ceramic spacers 48 of the package 39, the spacers 48 having been coated with gold-germanium solder which adheres to the gold layer 38, shown in FIG. 1 on the underside of the interface chip 12.

The outer regions of the interface chip 12 lying between the solder pads 36 and the transducer chip 10 may be advantageously used to carry integrated circuits which are necessary for proper operation of the transducer. For example, shown generally at 50 in FIG. 2 is a region where operational amplifiers may be integrated to be used to amplify the piezoresistor bridge signals. Also shown in FIG. 2 are two spaced regions 52 where temperature control circuits may be integrated which are used to control the temperature of the spring membrane 14. In this connection, the regions of the frame member 16 lying beneath the pillars 42 may contain heat dissipating devices, such as transistors, through which current can be passed to resistively heat the transducer chip 10. These same pillar regions of the frame member 16 may also contain temperature sensors in the form of diodes which can sense the temperature of the transducer chip 10, and through the temperature control circuits located at the regions 52 of the interface chip 12 regulate the temperature of the transducer chip 10. Other regions 53 between the two regions 52 may contain trimming resistors for zero balancing the bridge containing the piezoresistors 20.

It will be seen in FIG. 3 that the transducer chip 10 and interface chip 12 are in thermal and electrical contact at only a finite number of contact points 54 of discrete size. These contact points 54, which are few in number, correspond to the locations where the bonding pads 24 of the transducer chip 10, shown in FIG. 1, and the solder pads 34 of the interface chip 12 are joined together, such as by heating and alloying, according to a process known as flipchip bonding. Because of the small size and few number of contact points 54, thermal transfer between the interface chip 12 and the transducer chip 10 is minimized. The thickness of metal alloy at the contact points 54 in one operative embodiment is about 12 microns and provides 12 microns spacing between the spring membrane 14 and the interface chip 12.

The top surface of the interface chip 12 limits te maximum amount of flexure of the spring membrane 14 when it is subjected to a force. The thin volume between the spring membrane 14 and the transducer chip 12 serves as an excellent damping mechanism for enabling the spring membrane 14 to quickly return to its rest position when the force is removed. The damping mechanism resulting from the minute spacing of two flat plates by a thin volume of gas, such as air or some other fluid medium, is known as squeeze film damping, so called because the squeezing out of the gas between the two plates exerts a force upon each of them.

Figure 4:
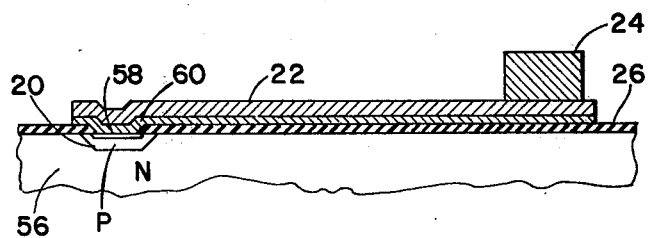
FIG. 4 is an enlarged sectional view showing the details of a metallic contact element of the interface chip prior to assembly with a metallic contact element of the transducer chip.
Figure 5:
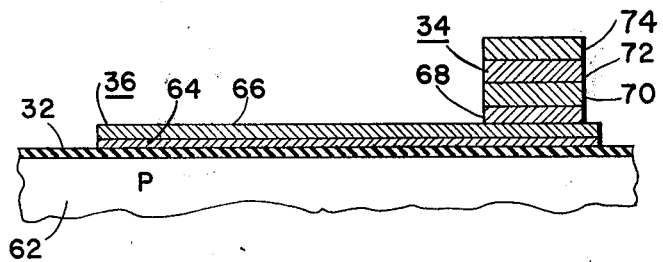
FIG. 5 is an enlarged sectional view showing the details of a metallic contact element of the transducer chip prior to assembly with a metallic contact element of the interface chip.

Reference is now made to FIGS. 4 and 5 for a more detailed description of the metal systems for the transducer chip 10 and the interface chip 12, respectively, suitable to provide a squeeze film of 12 microns. Referring first to FIG. 4, the transducer chip 10 may comprise a substrate 56 of N type silicon covered with an insulating layer 26 of silicon dioxide. A P type implanted region forms one of the piezoresistors 20.

Contact is made to the piezoresistor 20 through an opening in the insulating layer 26. The metal contact system for the piezoresistor 20 includes an alloy layer 58 of platinum an nickel silicide in ohmic contact with the piezoresistors 20. An underlayer 60 of titanium and tungsten alloy contacts the alloy layer 56 and extends over the insulating layer 26 to a location beneath a conductive bonding pad 24. A conductor 22 of gold extends over the underlayer 60 to the conductive bonding pad 24, which may be ten microns thickness of gold deposited on the conductor 22. The titanium-tungsten underlayer 60 is a diffusion barrier for the gold conductor 22.

Referring next to FIG. 5, the interface chip 12 may comprise a substrate 62 of P type silicon covered with an insulating layer 32 of silicon dioxide. A diffusion barrier underlayer 64 of titanium and tungsten alloy extends over the insulating layer 32 from a location beneath a wire bonding pad 36 to a location beneath a solder pad 34. A gold conductor 66, enlarged at one end to form the wire bonding pad 36, extends over the underlayer 60 to the solder pad 34 which is deposited on the gold conductor 66. The solder pad 34 is a laminate of four layers including a lowermost layer 68 of copper 4 microns thick, and then in ascending order a layer 70 of gold 5 microns thick, a layer 72 of tin 3 microns thick, and finally a layer 74 of gold 2 microns thick.

The transducer chip 10 is joined with the interface chip 12 by bonding the set of bonding pads 24 of the transducer chip 10 to the solder pads 34 of the interface chip 12. This may be done by mounting the transducer chip 10 and interface chip 12 in a jig with the bonding pads 24 and solder pads 34 contacting each other an heating the assembly in a furnace above the gold-tin eutectic temperature of 280° C. so that the bonding pads 24 and solder pads 34 solder together. After the completion of the soldering operation the transducer chip 10 and interface chip 12 will have been joined together with the desired 12 micron separation between the spring membrane 14 and the interface chip 12.

Referring to FIG. 3, the packaging is completed by hermetically sealing the assembled transducer chip 10 and interface chip 12 within an enclosure such as a metal cap 76. The rim 78 of the cap 76 is soldered to a gold coating 80 on the top surface of the ceramic package 39. The interior of the cap 76 may be evacuated of air through an exhaust tubulation 82 and then filled with an inert gas such as argon or nitrogen, or a damping fluid, after which the exhaust tubulation 82 is sealed.

Figure 6:
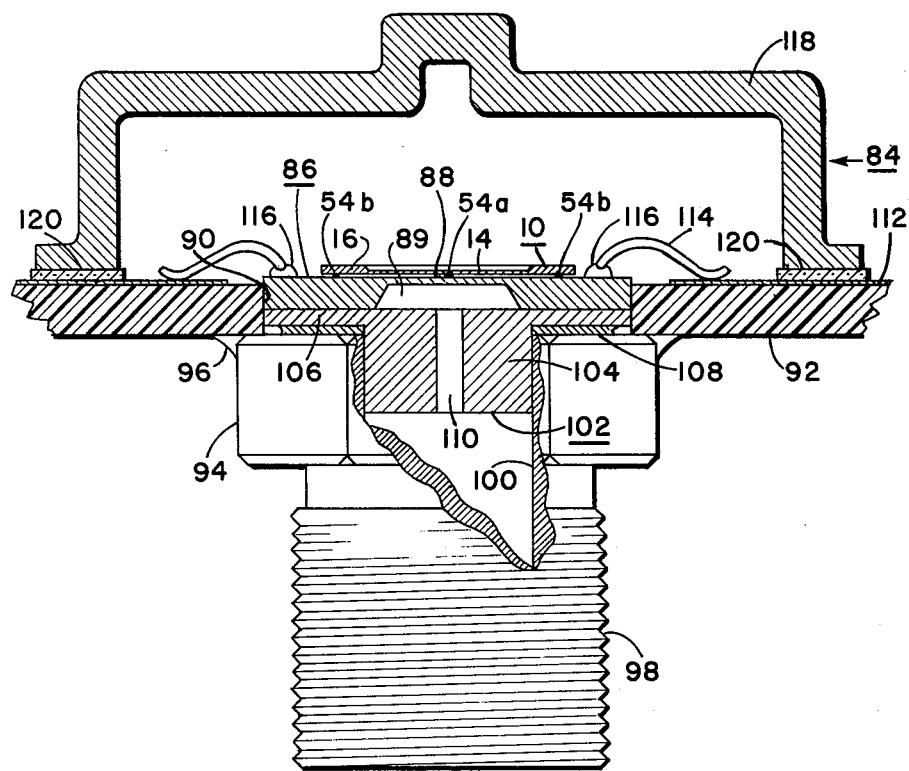
FIG. 6 is a side elevational view, partly in section, of a pressure transducer employing a transducer chip assembled on an interface chip according to the invention.

FIG. 6 shows a pressure transducer 84 incorporating a packaged transducer chip and interface chip assembly. The pressure transducer 84 includes a transducer chip 10 as described above, but the reaction mass 28 is omitted. The transducer chip 10 is mounted on and bonded to an interface chip 86 which, instead of the aperture 30 of the accelerometer above described, has a thinned down central portion 88 which is bonded to the center of the spring membrane 14 at a contact point 54a. The thinned down portion 88 may be formed by etching a recess 89 from the bottom side of the interface chip 86. The frame member 16 is bonded to the thicker portion of the interface chip 86 at several contact points 54b which, along with contact point 54a, are similar to the contact points 54 previously described in connection with FIG. 3.

The transducer chip 10 and interface chip 86 are mounted within an opening 90 formed in a printed circuit board 92. A metal body portion 94 depends from the bottom side of the opening 90. The body portion 94 is sealed around its upper periphery to the circuit board 92 by a soft solder ring 96. The body portion 94 has a threaded portion 98 at its lower end and is provided with a longitudinal central bore 100 for coupling to a source of pressurized fluid and conducting the fluid to the underside of the interface chip 86.

A metal stud 102 has a collar 104 that fits within the top end of the bore 100 and a flange 106 that is hermetically sealed on its underside to the body portion by a hard solder seal 108. The top side of the stud flange 106 is bonded to the bottom side of the interface chip 86 by means of a gold-silicon eutectic solder. The metal stud 102 has a small bore 110 for conducting pressurized fluid to the bottom side of the thinned portion 88 of the interface chip 86. Pressure applied to the thinned down portion 88 of the interface chip 86 will cause it to deform and produce corresponding deformation in the spring membrane 14 attached thereto.

The metal stud 102 is made of a metal having a coefficient of thermal expansion closely matching that of the silicon of the interface chip 86 to which it is bonded. Otherwise, thermal coefficient mismatch would result in differential expansion and contraction with temperature change whih could induce false signals from changes in piezoresistor resistance. For this purpose the metal stud 102 may be made of molybdenum.

The top surface of the printed circuit board 92 carries a conductive wire pattern 112 which is connected by bonding wires 114 to wire bonding pads 116 on the interface chip 86. A metal cap 118 sealed to the top side of the printed circuit board 92 by means of the glass frit 120 encloses and seals the transducer assembly hermetically.

What is claimed is:

1. A semiconductor transducer assembly, comprising:
   (a) a rigid mounting member;
   (b) a transducer member including a relatively thick peripheral frame portion and a relatively thin membrane portion attached to and circumscribed by said frame portion, said membrane portion being slotted to form a folded cantilever spring susceptible to vibratory motion relative to said frame portion, at least said membrane portion being formed of semiconductor material and provided with regions forming piezoresistor elements which change their electrical resistance when subjected to varying degree of mechanical stress;
   (c) a rigid interface member of semiconductor material separating said transducer member from said mounting member and having a first side facing said transducer member and an opposing second side facing said mounting member;
   (d) means securing said mounting member to surface portions at least of the second side of said interface member;
   (e) means securing the frame portion only of said transducer member to the first side of said interface member at a limited number of spaced locations distributed so as to produce an unobstructed finite gap between said membrane portion and said interface member for permitting restrained bending motion of said membrane during application of mechanical force thereto and for effecting squeeze film damping of vibratory motion of said membrane after removal of said mechanical force.

2. The invention according to claim 1, wherein said securing means in (e) comprise electrically conductive pads, and further including means coupling said piezoresistor elements to said conductive pads.

3. The invention according to claim 1, wherein said piezoresistor elements comprise ion implanted semiconductor regions.

4. The invention according to claim 1, wherein the gap in (e) between said membrane portion and said interface member is on the order of about 12 microns.

5. The invention according to claim 1, wherein said interface member is provided with a centrally located void region in said first side facing said transducer member, and further including an element of material having a higher density than the semiconductor material of said membrane portion affixed to a surface region of said membrane portion facing said void region so as to be capable of unobstructed vibratory movement axially of said interface chip when said assembly is subjected to external accelerating or vibratory force.

6. The invention according to claim 1, and further including a plurality of integrated circuits formed in surface regions of said interface member exclusive of the area circumscribed by said transducer member and serving to detect resistance changes in said piezoresistive elements.

7. The invention according to claim 1, and furhter including means enclosing said transducer member and said interface member about a hermetical seal formed with said mounting member.

8. The invention according to claim 1, wherein said membrane has a re-entrant shaped folded cantilever spring pattern.

9. The invention according to claim 1, wherein said interface member is provided with a centrally located recess extending from the second side thereof so as to form a thinned down portion of substantially smaller thickness than the surrounding portion of the interface member; and means bonding said thinned down portion to said membrane portion at a central contact region of limited dimension.

10. A pressure transducer, comprising:
(a) a circuit board provided with an opening;
(b) a semiconductor transducer assembly according to claim 9 mounted within said opening; and
(c) means secured to a side of said circuit board for conducting a fluid under pressure to the recess and against the side of the thinned down portion of said interface member facing the recess.

11. A pressure transducer according to claim 10, and further including means hermetically enclosing said semiconductor transducer assembly about said circuit board opening.

* * * * *